(12) United States Patent
Boroson et al.

(10) Patent No.: US 7,586,497 B2
(45) Date of Patent: Sep. 8, 2009

(54) OLED DISPLAY WITH IMPROVED POWER PERFORMANCE

(75) Inventors: Michael L. Boroson, Rochester, NY (US); John E. Ludwicki, Churchville, NY (US); Michael J. Murdoch, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 739 days.

(21) Appl. No.: 11/312,872

(22) Filed: Dec. 20, 2005

(65) Prior Publication Data

US 2007/0139437 A1   Jun. 21, 2007

(51) Int. Cl.
G09G 5/02 (2006.01)
G09G 3/32 (2006.01)

(52) U.S. Cl. ............................ 345/590; 345/82; 345/83; 345/589

(58) Field of Classification Search .................... 345/55, 345/76, 82, 83, 84, 87, 88, 90, 92, 204, 690, 345/581, 589, 590, 591, 593, 596, 597
See application file for complete search history.

(56) References Cited

U.S. PATENT DOCUMENTS

| | | | |
|---|---|---|---|
| 4,356,429 A | 10/1982 | Tang | |
| 5,550,066 A | 8/1996 | Tang et al. | |
| 6,281,634 B1 | 8/2001 | Yokoyama | |
| 6,456,013 B1 | 9/2002 | Komiya et al. | |
| 6,552,079 B2 | 4/2003 | Scarborough et al. | |
| 6,570,584 B1 * | 5/2003 | Cok et al. | 345/690 |
| 6,771,028 B1 * | 8/2004 | Winters | 315/169.1 |
| 7,190,122 B2 * | 3/2007 | Winters et al. | 315/169.1 |
| 2002/0186214 A1 | 12/2002 | Siwinski | |
| 2003/0122496 A1 | 7/2003 | Lee et al. | |
| 2004/0058193 A1 * | 3/2004 | Hatwar | 428/690 |
| 2004/0113875 A1 | 6/2004 | Miller et al. | |
| 2004/0201558 A1 | 10/2004 | Arnold et al. | |
| 2005/0099426 A1 | 5/2005 | Primerano et al. | |
| 2005/0168490 A1 * | 8/2005 | Takahara | 345/690 |
| 2006/0197458 A1 | 9/2006 | Winters et al. | |
| 2007/0257945 A1 * | 11/2007 | Miller et al. | 345/694 |

FOREIGN PATENT DOCUMENTS

| | | |
|---|---|---|
| WO | 2005/088593 | 9/2005 |
| WO | 2006/106451 | 10/2006 |

* cited by examiner

Primary Examiner—My-Chau T Tran
(74) Attorney, Agent, or Firm—Raymond L. Owens

(57) ABSTRACT

An OLED display for producing a full color image, comprising a plurality of at least four different colored pixels including three different colored addressable gamut-defining pixels and a fourth addressable within-gamut pixel, each pixel having an organic light-emitting diode with first and second electrodes and one or more organic light-emitting layers provided between the electrodes; the OLED display having a selected display white point, display peak luminance, gamut-defining pixel peak luminances and within-gamut pixel peak luminance; and drive circuitry for regulating luminance of the organic light-emitting diode of each of the colored pixels wherein the sum of the gamut-defining pixel peak luminances is less than the display peak luminance.

9 Claims, 10 Drawing Sheets

OLED DISPLAY WITH IMPROVED POWER PERFORMANCE

CROSS REFERENCE TO RELATED APPLICATIONS

Reference is made to commonly assigned U.S. patent application Ser. No. 11/069,652, filed Mar. 1, 2005 of Winters, et al., entitled OLED DISPLAY WITH IMPROVED ACTIVE MATRIX CIRCUITRY; and U.S. Patent Publication No. 2005/0225232, published Oct. 13, 2005 of Boroson et al., entitled COLOR OLED WITH ADDED COLOR GAMUT PIXELS.

FIELD OF THE INVENTION

The present invention relates to efficiently driving pixels in an active matrix OLED display.

BACKGROUND OF THE INVENTION

In the simplest form, an organic electroluminescent (EL) device is comprised of an organic electroluminescent media disposed between first and second electrodes serving as an anode for hole injection and a cathode for electron injection. The organic electroluminescent media supports recombination of holes and electrons that yields emission of light. These devices are also commonly referred to as organic light-emitting diodes, or OLEDs. A basic organic EL element is described in U.S. Pat. No. 4,356,429. In order to construct a pixelated OLED display that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display. For purposes of this disclosure, a pixel is considered the smallest individual unit, which can be independently stimulated to produce light. As such, the red pixel, the green pixel, and the blue pixel are considered as three distinct pixels.

Color OLED displays have also recently been described that are constructed as to have four different colored pixels. One type of OLED display having four different colored pixels that are red, green, blue, and white in color is known as an RGBW design. Examples of such four pixel displays are shown in U.S. Pat. No. 6,771,028, U.S. Patent Application Publication Nos. 2002/0186214 A1; 2004/0113875 A1; and 2004/0201558 A1. Such RGBW displays can be constructed using a white organic EL emitting layer with red, green, and blue color filters for the red, green, and blue pixels, respectively. The white pixel area is left unfiltered. This design has the advantage that the organic electroluminescent media does not require patterning between the different colored pixels, thereby simplifying the manufacturing process. Furthermore, inclusion of the unfiltered white pixel allows for the display of most colors at reduced power consumption compared to similar RGB displays having a white organic EL emitting layer with red, green, and blue filters for the red, green, and blue pixels, respectively.

OLED displays driven with active matrix circuitry have also been shown. Active matrix circuitry typically includes active circuit components such as multiple transistors and one or more capacitors per pixel as well as signal lines such as data, scan, and power lines, which are shared by the pixels of a row or column. Each pixel in an active matrix OLED display is provided with at least one power transistor. A power transistor regulates the current flow to the pixel's organic EL element in response to a data signal provided on a data line. The power transistor draws current from a power line, which is electrically connected to a voltage source. This current is passed to the first electrode and the organic EL media of the pixel's organic EL element. The second electrode, which is disposed above the organic EL media and the active matrix circuitry, is then electrically connected to a second voltage source, which completes the current path. Examples of organic EL displays driven by active matrix circuitry are shown in U.S. Pat. Nos. 5,550,066; 6,281,634; and 6,456,013.

However, in OLED displays driven by active matrix circuitry, the voltage difference between the voltage source electrically connected to the power line and the voltage source electrically connected to the second electrode is at a level sufficient to power all the pixels connected to the power line at their highest level of intensity. This voltage difference, or drop, is split between the organic EL element and the power transistor. Therefore, when pixels are operated at a lower level of intensity, the supplied voltage is more than is required and the percentage of the voltage drop across the power transistors in these pixels is increased. Since power consumption is a function of the current flow and the voltage drop, this extra voltage drop results in poor power efficiency.

Active matrix OLED displays have been shown where different colored pixels are connected to the same power line, e.g. U.S. Pat. No. 6,456,013. Also, active matrix OLED displays have been shown where adjacent columns of pixels share the same power line in U.S. Pat. No. 6,522,079. Similarly, examples where the same power line is shared by pixels of differing colors or pixels in adjacent rows for an RGBW type active matrix display are shown in U.S. Pat. No. 6,771,028. However, such different colored pixels frequently require different maximum voltage levels. In such displays, the voltage is commonly set at a level to drive the most demanding pixels, resulting in poor power efficiency.

SUMMARY OF THE INVENTION

It is therefore an object of the present invention to provide an OLED display with improved power efficiency.

This object is achieved by an OLED display for producing a full color image, comprising:

a) a plurality of at least four different colored pixels including three different colored addressable gamut-defining pixels and a fourth addressable within-gamut pixel, each pixel having an organic light-emitting diode with first and second electrodes and one or more organic light-emitting layers provided between the electrodes;

b) the OLED display having a selected display white point, display peak luminance, gamut-defining pixel peak luminances and within-gamut pixel peak luminance; and c) drive circuitry for regulating luminance of the organic light-emitting diode of each of the colored pixels wherein the sum of the gamut-defining pixel peak luminances is less than the display peak luminance.

This object is further achieved by a method for operating an OLED display for producing a full color image at reduced power, comprising:

a) providing a plurality of at least four different colored pixels including three different colored addressable gamut-defining pixels and a fourth addressable within-gamut pixel, each pixel having an organic light-emitting diode with first and second electrodes and one or more organic light-emitting layers provided between the electrodes;

b) selecting a display white point, display peak luminance, gamut-defining pixel peak luminances and within-gamut pixel peak luminance; and c) regulating luminance of the organic light-emitting diode of each of the colored pixels wherein the sum of the gamut-defining pixel peak luminances is less than the display peak luminance.

ADVANTAGES

It is an advantage of this invention that it provides an OLED display with lower current requirements, leading to lower overall power consumption for the device. It is a further advantage of some embodiments of this invention that the lifetime of the device can be increased. It is a further advantage of some embodiments of this invention that the voltage requirements of the device can be decreased, leading to additional power consumption reductions.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED display" or "organic light-emitting display" is used in its art-recognized meaning of a display device comprising organic light-emitting diodes (OLED) as pixels. A color OLED display emits light of at least one color. The term "multicolor" is employed to describe a display panel that is capable of emitting light of different spectral power distributions in different areas. In particular, it is employed to describe a display panel that is capable of displaying images of different colors. These areas are not necessarily contiguous. The term "full color" is employed to describe multicolor display panels that are capable of emitting different selective spectral power distributions and modulating and mixing these emissions. Various mixtures of the multicolor pixels therefore provide a viewer with the impression of a large combination of hues. In general, red, green, and blue colors constitute three primary colors from which many other colors can be generated by appropriate mixing. However, for this invention, full color can include pixels of other colors. The term "pixel" is employed in its art-recognized usage to designate an area of a display panel that can be stimulated to emit light independently of other areas. However, it is recognized that in full color systems, several pixels of different colors will be used together to generate a broad range of colors, and it is common to term such a group a single pixel. For example, in a three-color RGB full color display, a group of pixels generally comprises three primary-color pixels, namely red, green, and blue (RGB). For the purposes of this invention, the term "OLED device" will also be used to refer to a pixel.

Figure 1:
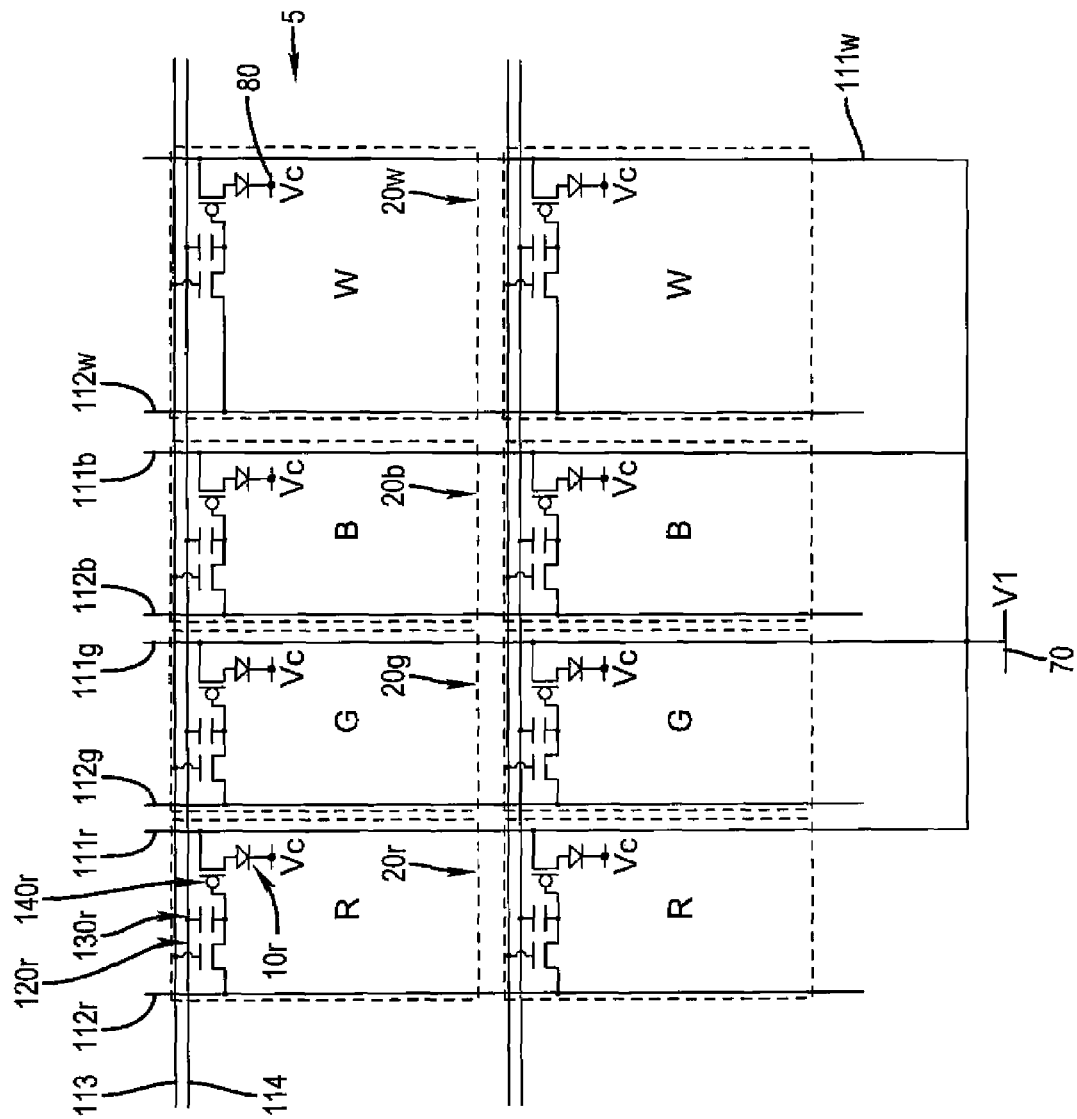
FIG. 1 depicts a circuit layout of the active matrix drive circuitry of a display according to one embodiment of the present invention.
Figure 9:
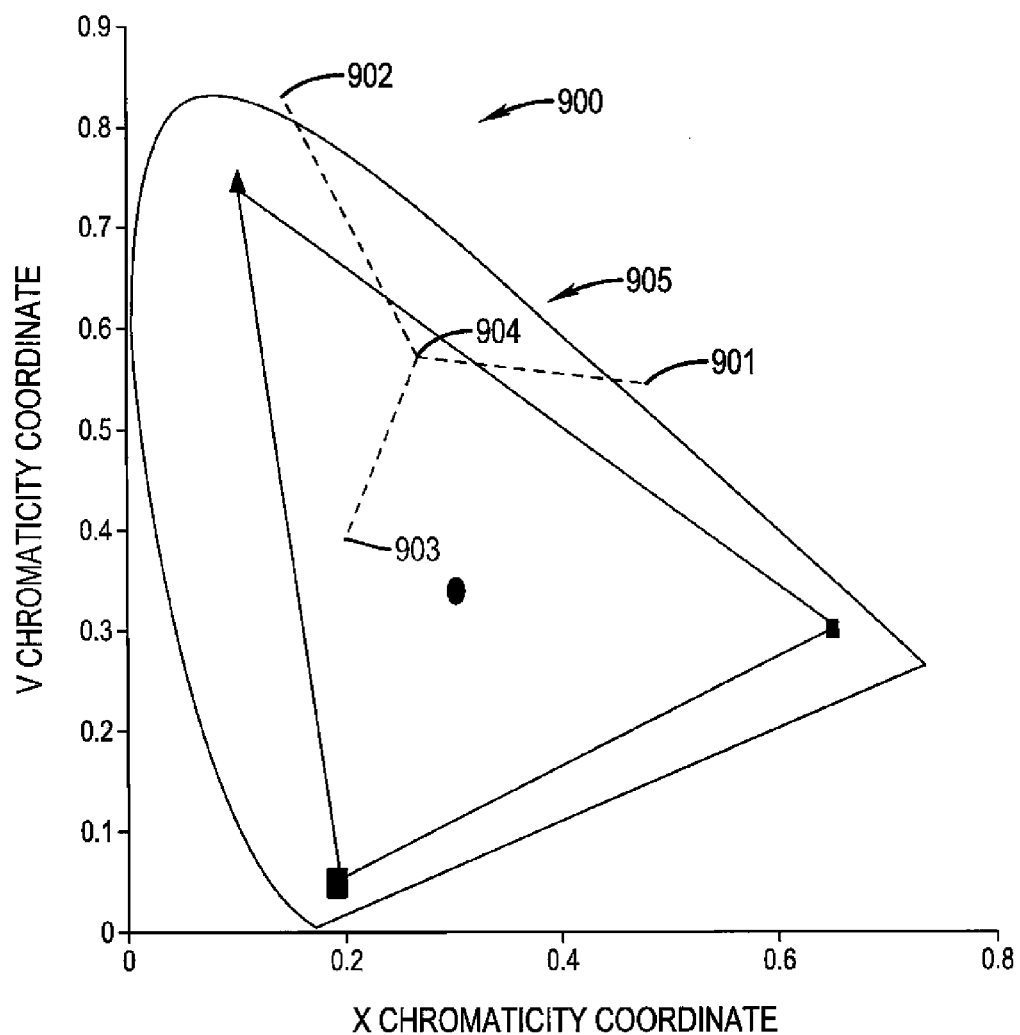
FIG. 9 shows a CIE 1931 xy chromaticity diagram with a spectrum locus and red, green, and blue emitters.

FIG. 1 shows a circuit schematic diagram for the active matrix drive circuitry of an active matrix type OLED display according to one embodiment of the present invention. FIG. 1 shows several rows and columns of pixels. While only a limited number of rows and columns are shown, one skilled in the art can expand this design to a larger plurality of rows and columns. OLED display 5 is an RGBX type OLED display having at least four different colored pixels for producing a full color image. Each pixel (e.g. 20r, 20g, etc.) has an organic light-emitting diode with first and second electrodes, e.g. cathode and anode, and one or more organic light-emitting layers provided between the electrodes. Each pixel is addressable, which means the intensity of the pixel can be independently controlled. In OLED display 5, at least three of the different colored pixels, such as pixel 20r, pixel 20g, and pixel 20b are gamut-defining pixels that emit different colors, and which determine the color gamut of the display. In this case, gamut-defining pixel 20r is arranged to produce red light, gamut-defining pixel 20g is arranged to produce green light, and gamut-defining pixel 20b is arranged to produce blue light. The concept of gamut-defining pixels is illustrated in FIG. 9, which shows a CIE 1931 xy chromaticity diagram with spectrum locus 900, red emitter 901, green emitter 902, and blue emitter 903. The red, green, and blue emitters, which are the gamut-defining pixels described herein, define color gamut 905. However, one can use other colors for the gamut-defining pixels. One can also use four or more gamut-defining pixels, as described by Boroson et al. in U.S. Patent Publication No. 2005/0225232. Illuminating two or more of the gamut-defining pixels to varying intensities can produce other colors within color gamut 905. Such colors are referred to as within-gamut colors. OLED display 5 also has at least one additional pixel, such as pixel 20w, called a within-gamut pixel, which is arranged to emit a within-gamut color light, for example white emitter 904 in FIG. 9. Within-gamut pixel 20w most commonly produces white light, in which case the display is an RGBW display. The term white is used in the present invention to indicate any light emission that is perceived as approximately white to a viewer. However, the present invention is not limited to a white pixel and other colors which are, for example, more blue, green, red, yellow, magenta, or cyan in appearance can be also be employed. Thus, one can have an RGBY (red, green, blue, yellow) display. Such displays can be designated as RGBX displays, wherein X refers to a within-gamut pixel. For the practice of this invention, it will be understood that RGBW displays can also refer to the more general RGBX displays.

OLED display 5 uses within-gamut pixels to reduce power consumption compared to conventional RGB type displays. These within-gamut pixels are more efficient than at least one of the gamut-defining pixels and are typically more efficient than all of the gamut-defining pixels. Efficiency, which can be measured in (cd/A), is determined as the amount of light emitted from the device (the luminance) per unit of current. Power consumed by the device, which can be measured in, for example, watts (W), is determined by the current flow required to produce the desired luminance multiplied by the applied voltage drop (V) across the organic light-emitting diode as well as any circuit components electrically connected between the organic light-emitting diode and the voltage source. In an RGBW type display, within-gamut colors can also be displayed by illuminating the within-gamut pixel in combination with one or more of the gamut-defining pixels at varying intensities. In this way, the RGBW OLED display can produce a full color image at reduced power.

OLED display 5 has a selected display white point, which is typically specified in CIE 1931 xy chromaticity coordinates. This can have the same chromaticity coordinates as the within-gamut pixel 20w when the within-gamut pixel is a white-emitting pixel. In many cases, the chromaticity coordinates of the within-gamut pixel 20w do not match the chromaticity coordinates of the selected display white point. In these cases, the selected display white point can be provided by activating the within-gamut pixel 20w and one or more of the gamut-defining pixels. Because the display white point is within the color gamut of the gamut-defining pixels, it can also be provided by activating some combination of the gamut-defining pixels alone. It is well known in the art to compute the fractions of each gamut-defining pixel required to match the chromaticity coordinates of the display white point.

OLED display 5 has a selected display peak luminance, expressed in units such as candelas per square meter or simply as a normalized value such as 100%, which is the maximum luminance of the display at the chromaticity coordinates of the selected display white point. For calculation purposes, the fractions of each gamut-defining pixel required to match the chromaticity coordinates of the display white point may be scaled by the display peak luminance, resulting in a theoretical peak luminance value for each gamut-defining pixel. These theoretical peak luminance values are determined as if no within-gamut pixels are used in the display. Each gamut-defining pixel has a theoretical peak current to provide the theoretical peak luminance, and a theoretical peak current density based upon the size of each pixel. In practice, such theoretical values are not always achievable or useful; therefore, for the purposes of this invention, we define for each pixel a nominal peak luminance, a nominal peak current, and a nominal peak current density, each of which can be at or near the theoretical peak values. In a display with three gamut-defining pixels, such as RGB, with no within-gamut pixels, the nominal peak luminance values of each of the within-gamut pixels must be realized in order to provide the display white point at the display peak luminance. In an RGBW system according to the present invention, the display white point and display peak luminance can be provided in the same way, or alternatively, by activating within-gamut pixel 20w alone or with some combination of one or more of the gamut-defining pixels. The nominal peak luminance of the within-gamut pixel is the luminance required in this situation to reproduce the display white point at the display peak luminance.

For convenience, the nominal peak luminance of a given pixel, gamut-defining or within-gamut, as described herein, can be referred to as one unit of intensity of that pixel. Intensity, by this definition, is a fraction of the nominal peak luminance, and mixtures of the display pixels can be described as combinations of intensity values. Thus, an RGB display produces its display white point at its display peak luminance with an intensity triad of (1,1,1). Similarly, an RGBW display whose within-gamut pixel shares the chromaticity coordinates of its display white point can produce the display white point at the display peak luminance with intensity quads of (1,1,1,0), (0,0,0,1), or many other combinations including but not limited to (0.5, 0.5, 0.5, 0.5) or (0.25, 0.25, 0.25, 0.75).

Luminance, and thus intensity, correlates with current through the OLED devices in an approximately linear fashion. For a given pixel of a given display, luminance is related to current, which for a given pixel area is related to current density. Similarly, nominal peak luminance is related to nominal peak current, which for a given pixel area is related to nominal peak current density. In an RGBW display system according to an embodiment of the present invention, the peak luminance of at least one of the gamut-defining pixels is reduced relative to the corresponding nominal peak luminance. This results in a peak current lower than the nominal peak current for the gamut-defining pixel. A lower peak current results in improved power efficiency of the pixel, and, in some cases, improved lifetime for the pixel.

Figure 10:
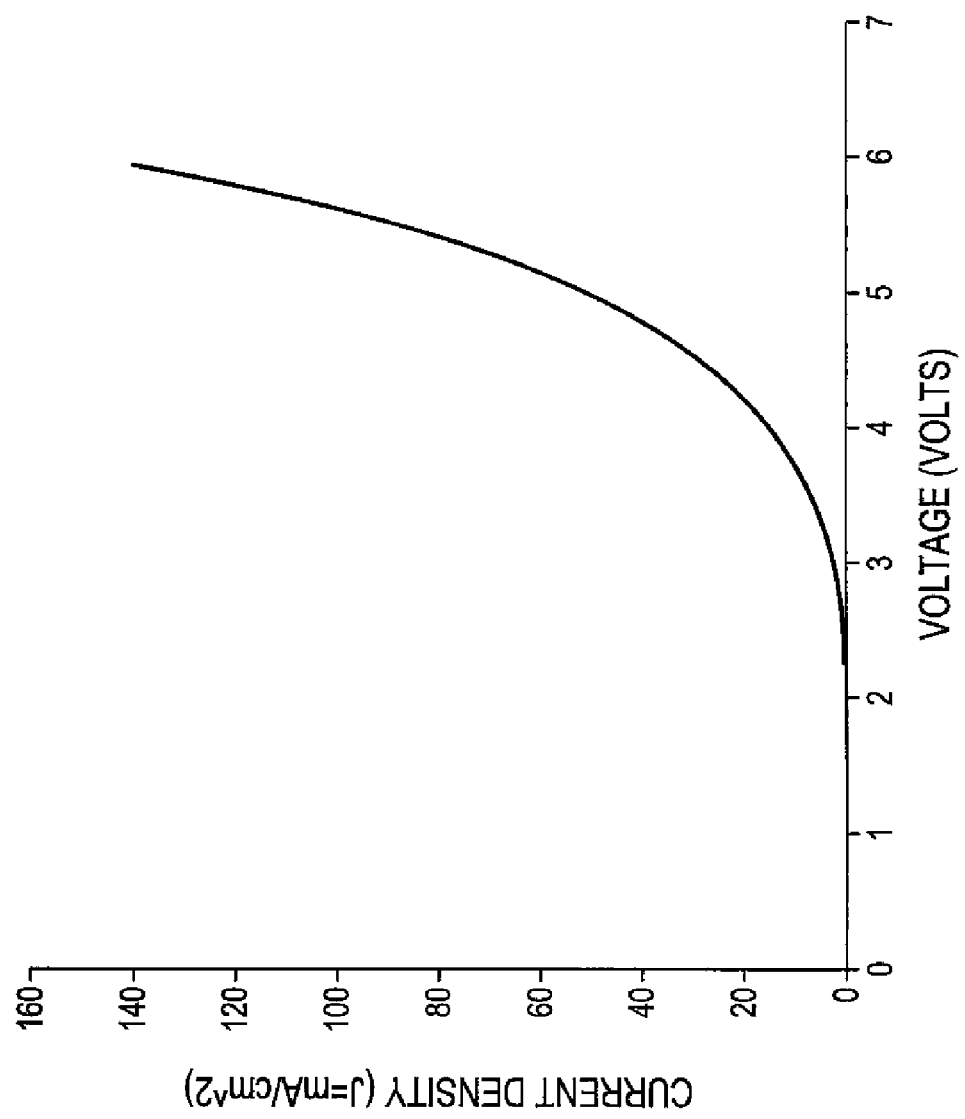
FIG. 10 shows a plot of current density vs. voltage for an OLED device.

The peak current densities determine the amount of voltage that must be provided between the first and second electrodes in the OLED device. The required OLED voltage for the pixel can be determined from a plot of current density vs. voltage for a given OLED. FIG. 10 is an example of such a plot. For example, to provide a peak current density of 100 ma/cm$^2$, the voltage must be at least 5.5 volts. In a system according to an embodiment of the present invention, the peak current densities of the gamut-defining pixels are reduced, often resulting in a lower voltage requirement for the pixel. A lower voltage requirement results in a further improvement in the power efficiency of the pixel. The aforementioned improvements may be gained with each gamut-defining pixel independently, but it is preferable to gain improvements from all three gamut-defining pixels together.

The active matrix drive circuitry of OLED display 5 comprises signal lines such as select line 113, capacitor line 114, data line 112r, data line 112g, data line 112b, data line 112w, power line 111r, power line 111g, power line 111b, and power line 111w. These signal lines are common to a row or a column of pixels as shown and are arranged to drive the pixels of the row or column. The active matrix drive circuitry further includes components such as one or more select transistors, power transistors, and storage capacitors for each pixel, e.g. select transistor 120r, power transistor 140r, and storage capacitor 130r, which together with one of more of the signal lines are arranged to drive the organic light-emitting diode 10r of pixel 20r. The other pixels are provided with similar components to drive the respective organic light-emitting diodes of the pixels. The drive circuitry regulates luminance of the organic light-emitting diodes of each of the colored pixels by regulating current between zero and the peak current of the pixel. The peak current, which is the maximum current that the drive circuitry will allow to pass through a given pixel, can be as high as the nominal peak current. For the purposes of this invention, however, the peak current of one or more gamut-defining pixels will be less than its corresponding nominal peak current. This will be described further below. The power transistor regulates current through the organic light-emitting diode of the colored pixel, e.g. power transistor 140r regulates current through organic light-emitting diode 10r of pixel 20r. A power line is associated with the power transistor of each different colored pixel, e.g. power line 111r is associated with power transistor 140r of red-emitting pixel 20r. The power lines associated with the power transistors of each of the different colored pixels, e.g. power lines 111r, 111g, 111b, and 111w, are connected together and are connected to a first voltage source 70, designated as V1. The term electrical connection is used in this disclosure to indicate connection either directly by way of a conductor or indirectly through a component such as a switch, transistor, diode or the like. A common top electrode connection is connected to the cathodes of all the organic light-emitting diodes to complete the circuit. This common top electrode connection is electrically connected to a second voltage source 80, designated as Vc. The present invention, however, is not limited to the case where the top electrode is common. For example, the top electrode can alternately be common to a single column of pixels and each column of pixels can be provided with a different top electrode. Other alternate configurations where individual top electrodes are provided for different rows or other groups of pixels or where each pixel is provided with its own isolated top electrode can also be practiced.

The power line (e.g. 111r) provides current from first voltage source 70 through the power transistor (e.g. 140r) and into the organic light-emitting diode (e.g. 10r) to second voltage source 80. While the circuit of this example is shown with the organic light-emitting diode arranged in a particular bias with the cathode connected to the common connection and the anode connected to the power transistor, the opposite arrangement can also be employed by one skilled in the art and is included within the scope of the present invention.

The drive circuitry operates in a manner well known in the art. Each row of pixels is selected in turn by applying a voltage signal to the select line associated with the row, such as select line 113, which turns on the select transistor, such as select transistor 120r, for each pixel. The luminance level, or intensity information, for each pixel is controlled by a voltage signal, which has been set on the data lines, such as data line 112r. The storage capacitor, such as storage capacitor 130r, for each pixel is then charged to the voltage level of the data line associated with that pixel and maintains the data voltage until the row is selected again during the next image frame. The storage capacitor 130r is connected to the gate terminal of the power transistor 140r. Power transistor 140r regulates the current flow through its source and drain terminals and to the organic light-emitting diode 10r in response to the voltage level held on its gate terminal by storage capacitor 130r, thereby regulating the pixel's luminance. Each row is then unselected by applying a voltage signal to the select line, which turns off the select transistors. The data line signal values are then set to the levels desired for the next row and the select line of the next row is turned on. This is repeated for every row of pixels.

As such, select lines are signal lines that serve the function of isolating a row of pixels so that the intensity information can be loaded into the pixels of the row. Data lines are signal lines that provide the intensity information to the pixels, that is, a signal corresponding to the luminance of a given pixel. This intensity information can be in the form of a voltage or current signal. Power lines are signal lines that provide a source of electrical power to the organic light-emitting diodes of the pixels for maintaining the luminance level of the pixel, at least during the time when the pixels row is not selected by the select line. Typically, the power lines provide a source of electrical power to the organic light-emitting diode at all times when the pixels are illuminated. Many alternate types of circuit arrangements known in the art having various arrangements and numbers of circuit components and signal lines are constructed with signal lines serving these basic functions. The present invention can be practiced on these alternate types of circuit arrangements by one skilled in the art and is not limited to the specific circuit arrangement shown here. These alternate arrangements include, for example, current mirror type circuits such as shown in U.S. Pat. Nos. 6,091,203, 6,501,466, 6,535,185 and 6,774,877 as well as the pixel circuits shown in U.S. Pat. No. 6,229,506 and the pixel circuit described in U.S. Patent Application Publication 2004/0222746 A1.

The voltage differential, V1−Vc, is the required display voltage. This voltage is typically determined by summing the required OLED voltage for the display (Voled), a voltage allowance for OLED aging (Vaging), the required TFT voltage (Vds), and a voltage allowance for resistive losses in the supply lines (Vres). The required OLED voltage for the display, Voled, is the maximum of the OLED voltages required for each pixels. For example, in an RGBW system, Voled is determined using the following equation:

$$Voled = MAX(Voled_R, Voled_G, Voled_B, Voled_W)$$

where $Voled_R$ is the required voltage for the red pixel, $Voled_R$ is the required voltage for the red pixel, $Voled_G$ is the required voltage for the green pixel, $Voled_B$ is the required voltage for the blue pixel, and $Voled_W$ is the required voltage for the white pixel. In a system according to the present invention, the required OLED voltage for each of the gamut-defining pixels is reduced because the peak current in each pixel is reduced. As long as the required OLED voltage for the gamut-defining pixels was originally higher than the required OLED voltage for the within-gamut pixel, which is often the case, the required OLED voltage for the display will be reduced.

In addition, the lower peak currents in each of the pixels result in lower peak current flows through the power lines (e.g. 111r) and through the power transistors (e.g. 140r). If the power lines remain the same size, a lower peak display current results in a lower resistive voltage drop allowance, Vres. Therefore, the required display voltage (V1−Vc) can be reduced even further. Any reduction in the required display voltage results in an improvement in power efficiency for the display. Alternately, the backplane designer may choose to keep the voltage drop the same by reducing the size of the power lines. This reduction of the power line size can be traded off for other display performance improvements, such as increased display lifetime or higher resolution by one skilled in the art. Similarly, lower currents through the power transistors allow the backplane designer to reduce the size of these power transistors. This reduction in power transistor size can be traded off for other display performance improvements, such as increased display lifetime or higher resolution by one skilled in the art. Winters, in U.S. patent application Ser. No. 11/069,652, described a method of reducing power consumption by providing at least two different first voltage sources, one for the within-gamut pixel (e.g. V1−Vc), and at least one for the gamut-defining pixels (e.g. V2−Vc). While this provides for lower power consumption, it increases the complexity of the device, requiring at least two independent sets of power lines in the drive circuitry for controlling two different voltage levels. It is desirable to reduce the number of different voltage levels that need to be supplied to the display. It is preferred that the power lines of all pixels be provided the same voltage level, as shown, even though these pixels can have differing voltage requirements. Therefore, only two voltage levels, represented as V1 and Vc, need be supplied to the power lines and common top electrode. However, it is also desirable to reduce the power consumption of the OLED display. Therefore, according to the present invention, the magnitude of the maximum voltage applied by the drive circuitry to the pixels, which is the magnitude of V1−Vc, is selected to be less than the magnitude of the voltage needed to fully drive the gamut-defining pixels, in this case pixel 20r, pixel 20g, and pixel 20b, but equal to or greater than the voltage needed to fully drive the within-gamut pixel, in this case pixel 20w. The maximum voltage is applied across first and second electrodes of the different colored pixels; these electrodes will be described further below. Selecting the maximum voltage as described herein is possible because the luminance of the organic light-emitting diode of each of the colored pixels is regulated such that the sum of the gamut-defining pixel peak luminances will be less than the display peak luminance. In other words, the maximum intensity for one or more of the gamut-defining pixels will be somewhat less than unity. While this is not always desirable in a display, in circumstances where low power consumption and/or longer device lifetime are paramount considerations, it can be an acceptable trade-off.

A plurality of pixels having the same color, for example red (R), green (G), blue (B) or white (W), can be present in a plurality of rows and columns. For example, a given column of pixels can include all red pixels and the entire column is therefore preferably connected to the same power line, as shown. Similarly, every fourth column of pixels can include all pixels of the same color. It is preferred that all the pixels be connected the same voltage level. The connecting of power lines of differing columns can be achieved by electrically connecting these power lines together with a conductor on one side of the display outside the pixel area.

Figure 2:
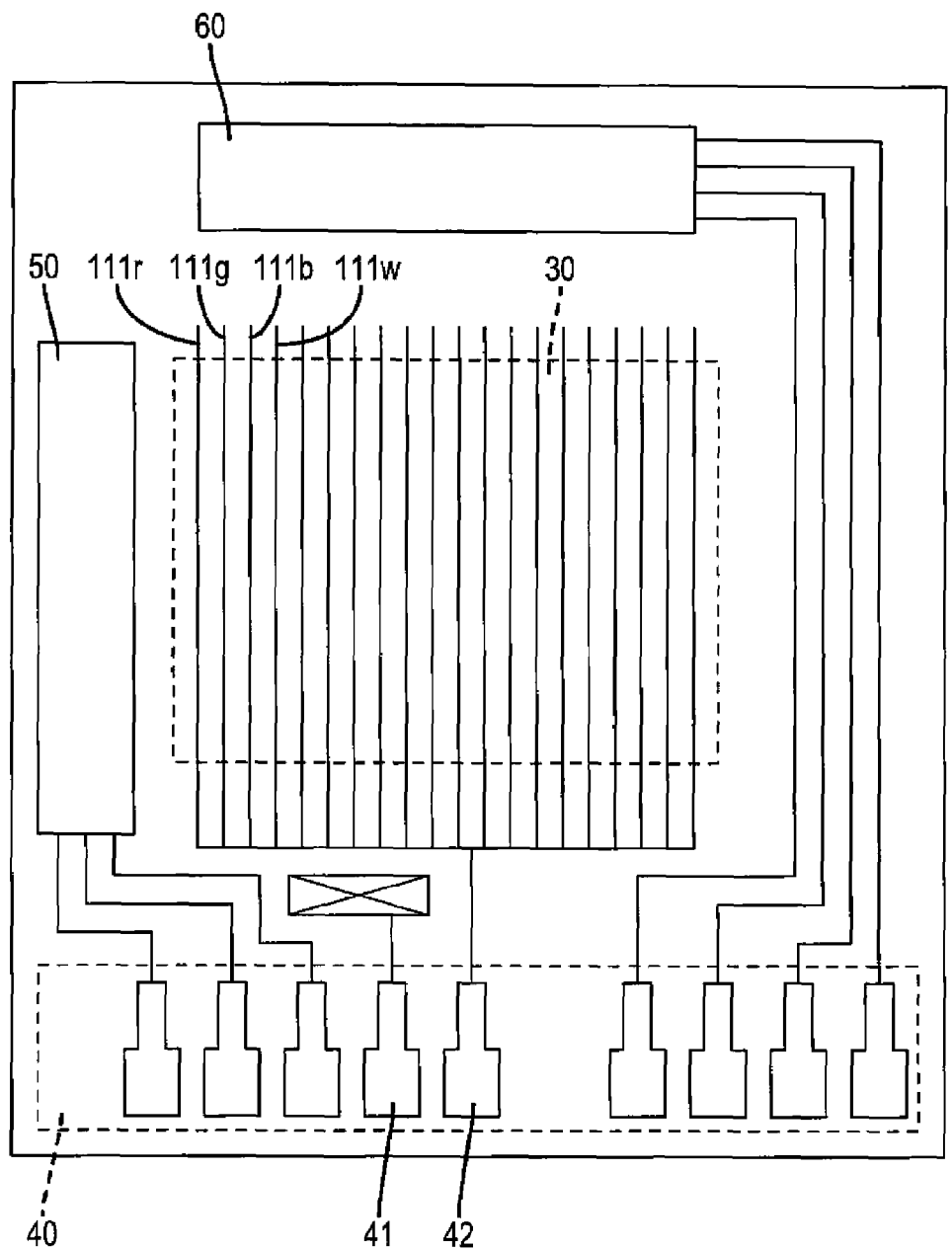
FIG. 2 depicts the layout and wiring of a display according to an embodiment of the present invention.

FIG. 2 shows a conceptual view of a display illustrating the layout and wiring of the various parts and sections of a display according one embodiment of the present invention. The display includes a pixel region 30, a connector region 40, a select line driver 50, and a data line driver 60. The select line driver 50 functions to selectively activate the select lines (not shown) for each row as previously described. The data line driver 60 serves to provide data signals to the data lines (not shown) for each column as previously described. The pixel region 30 includes the light-emitting pixels of the display. The regions outside of the pixel region 30 are non-light-emitting regions. The connector region 40 provides a plurality connector pads such connector pad 41 and connector pad 42. These connector pads serve as a location for bonding of wires or cables that electrically connect the display to external power sources (not shown) or controlling circuits (not shown). For example, connector pad 41 serves as a connection for the second voltage source Vc, and connector pad 42 serves as a connection for the first voltage source V1. It is preferable that the connector pads are all formed along one edge of the display and that the power lines associated with the power transistors of the different colored pixels, described above, are connected together on one side of the display, e.g. connector pad 42 is electrically connected to power lines such as power line 111r, power line 111g, power line 111b, and power line 111w outside of the pixel region 30, to reduce the size of the non-light-emitting regions of the display as well as simplify the connection process. While each of the voltages sources can be electrically connected to a single connector pad, multiple connector pads can also be used to provide a low resistance electrical connection to one or more of the voltage sources as described in U.S. Pat. No. 6,531,815.

Figure 3:
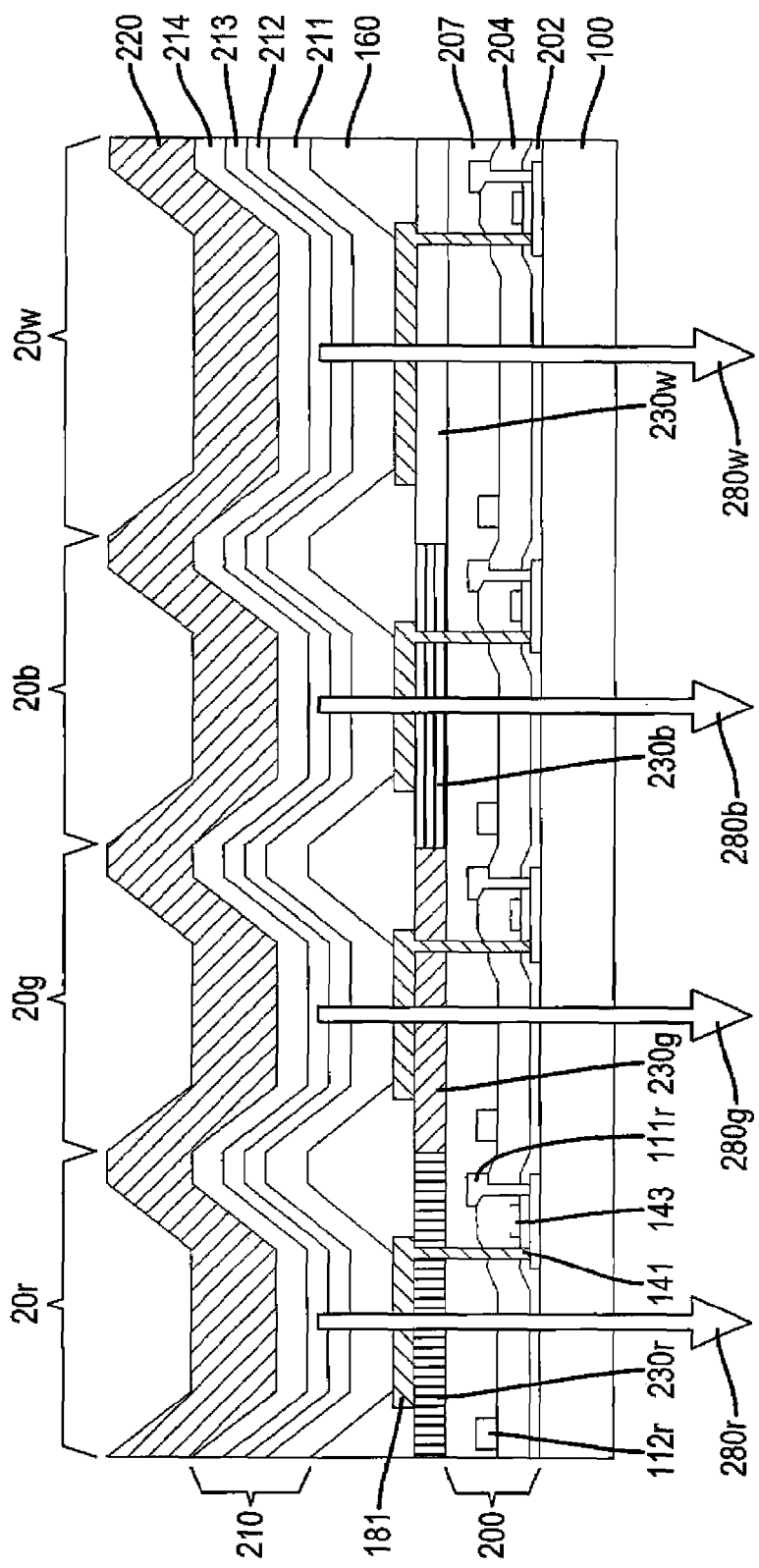
FIG. 3 depicts a cross-sectional view of a display according to one embodiment of this invention.

A cross-sectional view illustrating the vertical arrangement of the various layers of an OLED display is shown in FIG. 3. From FIG. 3, it can be seen that pixel 20r, pixel 20g, pixel 20b, and pixel 20w are formed above substrate 100. When electrically stimulated, these pixels produce light emission 280r, 280g, 280b and 280w respectively. Active matrix circuitry layers 200, including insulating layer 202, insulating layer 204, and insulating layer 207 are shown. The formation of the interpixel dielectric layer 160 over the edges of the first electrodes, such as first electrode 181, can also be seen. In the case where light is viewed through the substrate, as shown, these first electrodes are preferably constructed of a material that is highly transparent such as indium tin oxide. However, the present invention is not limited to this configuration, and devices can be constructed which emit in the opposite direction. In this case, the first electrodes are preferably constructed of a material that is reflective, such as aluminum or silver.

Each of the pixels further includes a portion of organic EL media 210. There are numerous configurations of the organic EL media 210 layers wherein the present invention can be successfully practiced. For the organic EL media, a broadband or white light source that emits light at the wavelengths used by all the pixels can be used to avoid the need for patterning the organic EL media between pixels. In this case, color filter elements, such as color filter element 230r, color filter element 230g, and color filter element 230b, are provided for the gamut-defining pixels in the path of the light to produce the desired light colors from the white or broadband emission for a multi-color display. Pixels that are to emit the same white or broadband emission as the organic EL media, such as pixel 20w, can remain unfiltered. In this case, a transparent filler 230w can optionally be provided in place of a color filter element. Some examples of organic EL media layers that emit broadband or white light are described, for example, in U.S. Pat. No. 6,696,177. However, the present invention can also be made to work where each pixel has one or more of the organic EL media layers separately patterned for each pixel to emit differing colors for specific pixels. The organic EL media 210 is constructed of several layers such as; a hole-injecting layer 211, a hole-transporting layer 212 that is disposed over hole-injecting layer 211, an organic light-emitting layer 213 disposed over hole-transporting layer 212, and an electron-transporting layer 214 disposed over light-emitting layer 213. Alternate constructions of the organic EL media 210 having fewer or more layers can also be used to successfully practice the present invention. Organic EL media layers applied in the opposite order are also known in the art and can be applied to the present invention. These organic EL media layers include organic materials that are either small molecule materials or polymer materials as is known in the art. These organic EL media layers can be deposited by one or more of several methods known in the art such as, for example, thermal evaporation in a vacuum chamber, laser transfer from a donor substrate, or deposition from a solvent by spin coating or use of an ink jet print apparatus.

Above the organic EL media 210, a second electrode 220 is formed. For a configuration where the light is viewed through the substrate, as shown, this electrode is preferably highly reflective and can be composed of a metal such as aluminum, silver, or magnesium/silver alloy. However, in an alternate embodiment where the light is viewed in the opposite direction, this electrode should be highly transparent and constructed of thin metals, such as silver with a thickness less than 25 nm, or transparent conductive oxides such as indium tin oxide, or combinations thereof. The second electrode 220 can also include an electron injecting layer (not shown) composed of a material such as lithium to aid in the injection of electrons. When a region of organic EL media 210 is stimulated by an electrical current between a first electrode, such as first electrode 181, and second electrode 220, the region of organic EL media 210 produces light emission.

Most OLED displays are sensitive to moisture or oxygen, or both, so they are commonly sealed with an encapsulating structure (not shown) in an inert atmosphere such as nitrogen or argon using metal or glass covers, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation and can be applied to the present invention by one skilled in the art.

In a preferred embodiment, the color filter elements shown in FIG. 3 are disposed in the path of the light produced in the emitting areas of the gamut-defining pixels so as to filter the color of the light prior to reaching the observer. The within-gamut pixel can optionally be provided with a transparent filler material or a color filter element to slightly modify its color. Alternately, the present invention can also be successfully practiced without providing a transparent filler material or color filter element for the within-gamut pixel.

The example described in FIG. 1 shows the pixels arranged in a stripe pattern, wherein pixels of the same color are aligned in the same column or row. However, the present invention is not limited to this case and alternate patterns where different colored pixels are arranged in the same columns or same rows can also be applied to the present invention. One pixel arrangement pattern that is particularly useful is a quad pattern where the four different colored pixels are arranged in a rectangular fashion involving two rows and two columns. Quad patterns are advantageous in that the all four different colored pixels are close to each other, thereby reducing the perception of band defects when one or more of the pixels are not illuminated in an image or portion of an image.

Figure 4:
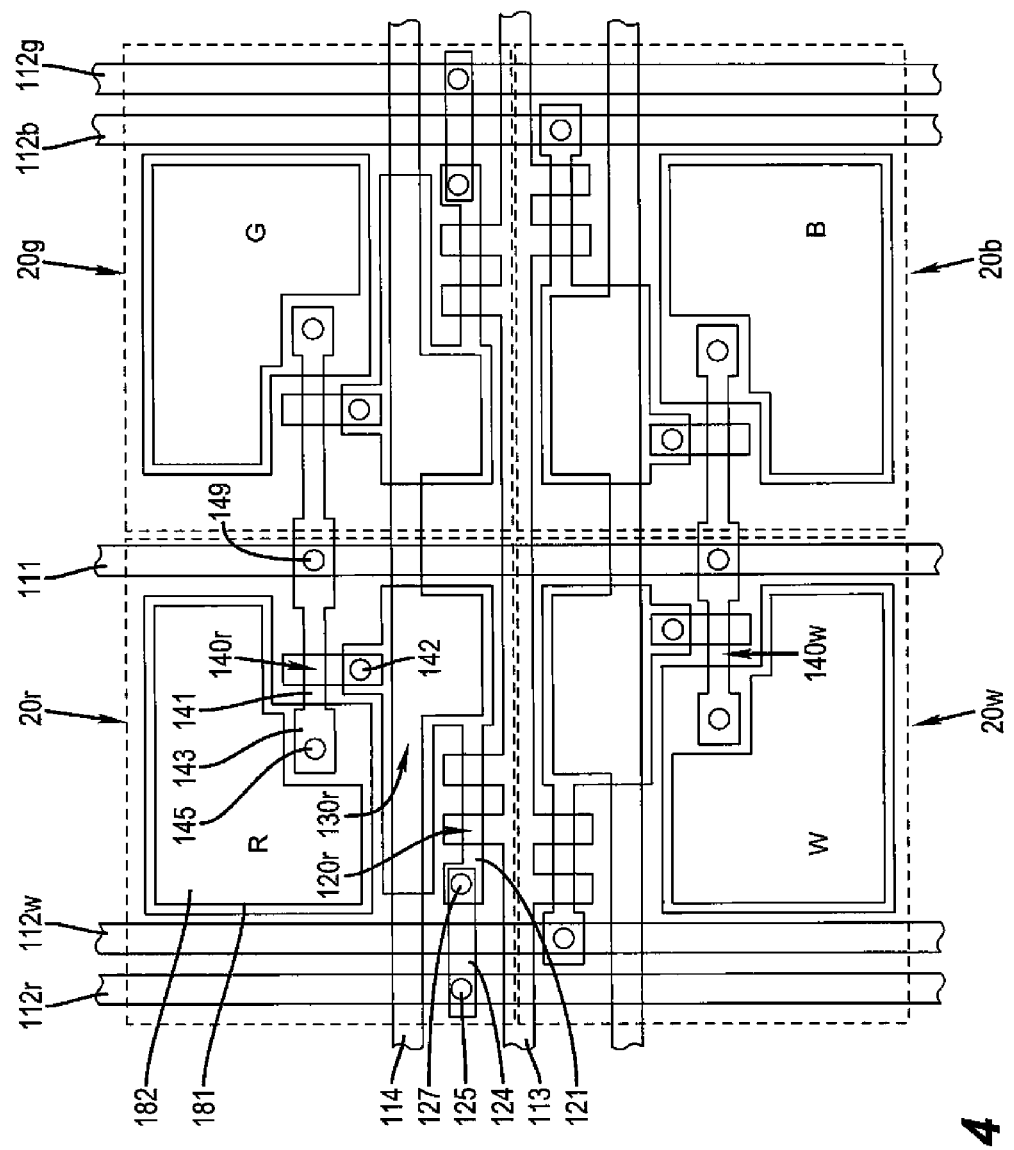
FIG. 4 depicts the construction and layout of the components of the drive circuitry used to drive pixels of a display according another embodiment of the present invention.

A layout diagram for the portions of drive circuitry used to drive a quad pattern arrangement of three gamut-defining pixels, including pixel 20r, pixel 20g, and pixel 20b, and one within-gamut pixel, pixel 20w according to an alternate embodiment of the present invention is shown in FIG. 4. Gamut-defining pixel 20r, gamut-defining pixel 20g, gamut-defining pixel 20b, and within-gamut pixel 20w can be constructed to emit red (R) light, green (G) light, blue (B) light, and white (W) light, respectively. However, the present invention is not limited to these specific colors and other colors can also be applied to the present invention by one skilled in the art.

In order to provide a source of electric power to the pixels, power line 111 is provided, which is electrically connected to each pixel. Specifically, a power transistor such as 140w is electrically connected to power line 111 by way of a via as shown. Power line 111 is electrically connected to a voltage source (not shown) that controls the magnitude of the voltage applied to the within-gamut pixel and the gamut-defining pixels. Since this arrangement provides only a single power line 111 for the four different colored pixels compared to the four shown for the stripe pattern of some of the other embodiments, the space occupied on the substrate by the power lines is reduced.

FIG. 4 further shows the construction and layout of the various circuit components such as select transistor 120r, storage capacitor 130r, and power transistor 140r. The drive circuitry components are fabricated using known integrated circuit and thin film transistor fabrication technologies. Select transistor 120r is formed from a first semiconductor region 121 using techniques well known in the art. Select transistor 120r is shown as a double gate type transistor, however, this is not required for successful practice of the present invention and a single gate type transistor can also be used. Similarly, power transistor 140r is formed in a second semiconductor region 141. The first semiconductor region 121 and second semiconductor region 141 are preferably formed from the same semiconductor layer. This semiconductor layer is preferably silicon such as polycrystalline or crystalline silicon, but can also be amorphous silicon. Other inorganic and organic semiconducting materials known in the art can also be used. This first semiconductor region 121 also forms one side of storage capacitor 130r. Over the first semiconductor region 121 and second semiconductor region 141, is an insulating layer (not shown) of a material such as silicon nitride that forms the gate insulator of select transistor 120r, the gate insulator for power transistor 140r, and the insulating layer of storage capacitor 130r. The gate of select transistor 120r is formed from part of select line 113, which is formed in the first conductor layer. Power transistor 140r has a separate power transistor gate 143 also preferably formed in the first conductor layer. The other electrode of storage capacitor 130r is formed as part of capacitor line 114, which is also preferably formed from the first conductive layer. Power line 111, data line 112r, data line 112g, data line 112b, and data line 112w are preferably formed from a second conductive layer. One or more of the signal lines, for example select line 113, frequently cross at least one or more of the other signal lines, such as for example data line 112r. As such, these signal lines are preferably fabricated from multiple conductive layers with at least one interlayer insulating layer (not shown) of a material such as silicon nitride disposed in between. The first electrode 181 of the organic light-emitting diode is connected to power transistor 140r. An insulating layer (not shown) of a material such as silicon nitride is located between the first electrode 181 and the second conductive layer.

Connections between layers are formed by etching holes (or vias) in the insulating layers. Via 142 connects the power transistor gate 143 to first semiconductor region 121, via 149 connects second semiconductor region 141 to power line 111, and via 145 connects second semiconductor region 141 to the first electrode 181. In order to allow data line 112r to be connected to select transistor 120r, data line 112b should be crossed. This is achieved using conductive bridge 124, which electrically connects to data line 112r by way of via 125 and to select transistor 120r by way of via 127. Conductive bridge 124 is constructed in a different conductor layer than the data lines, preferably the same conductor layer as the select lines.

First electrode 181 serves to provide electrical contact to the organic electroluminescent media of the organic light-emitting diodes. Over the perimeter edges of the first electrode, an interpixel dielectric layer can be formed to cover the edges of the electrodes and reduce shorting defects as described below. Such interpixel dielectric layers are also described in U.S. Pat. No. 6,246,179. Opening 182 is made in the interpixel dielectric layer over the first electrode 181 to permit the first electrode 181 to make electrical contact with the organic electroluminescent media of the organic light-emitting diode. The emitting area of pixel 20r is defined by the areas of the first electrode 181 that is in electrical contact with the organic electroluminescent media. As such, the emitting area is the area of the first electrode 181 reduced by any area covered by dielectric material. Therefore, when an interpixel is used as described, the emitting area is the area of the opening, such as opening 182, in the interpixel dielectric layer. While use of such an interpixel dielectric layer is preferred, it is not required for successful practice of the present invention.

Figure 5:
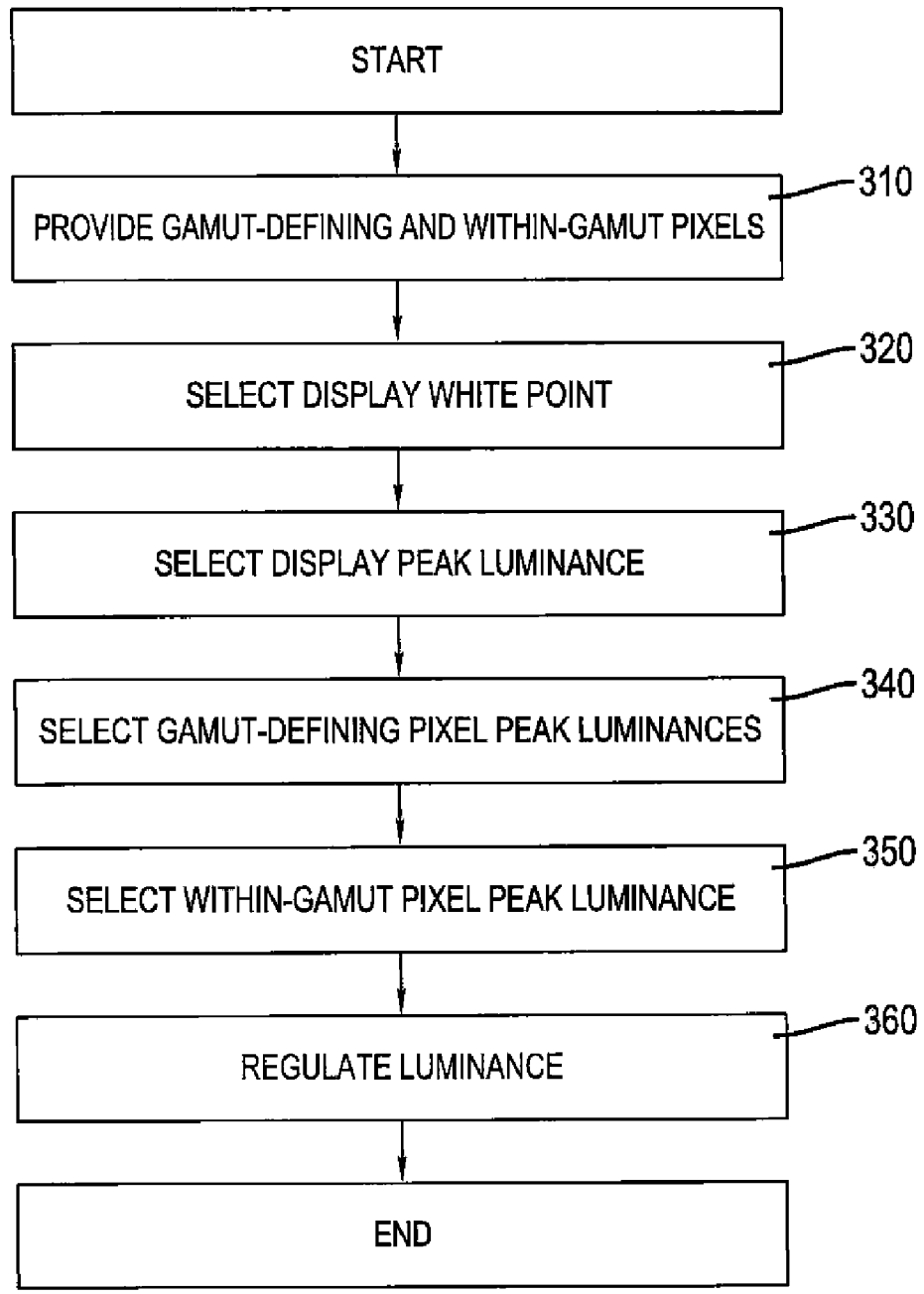
FIG. 5 is a block diagram showing a method for operating an OLED display for producing a full color image at reduced power in accordance with this invention.

Turning now to FIG. 5, and referring also to FIG. 1 and FIG. 3, there is shown a block diagram of a method for operating an OLED display for producing a full color image at reduced power in accordance with this invention. At the start, a plurality of at least four different colored pixels is provided, including three different colored addressable gamut-defining pixels and a fourth addressable within-gamut pixel (Step 310), for example, by constructing an OLED display as described herein. Each pixel has an organic light-emitting diode with first and second electrodes and one or more organic light-emitting layers provided between the electrodes. Further, drive circuitry as described above is provided for applying a maximum voltage and for regulating the current—and thus the luminance—of each pixel. A display white point is selected (Step 320). The exact display white point selected will depend on a number of factors, for example, the properties of the display and the expected usage conditions. A display peak luminance is selected (Step 330). The display peak luminance is the maximum luminance that the display can produce, and can be selected by the choices of construction of the display. Gamut-defining pixel peak luminances are selected (Step 340), and a within-gamut pixel peak luminance is selected (Step 350), which can be selected by choices of construction of the display and the pixels, and by the maximum current which will be used in the pixels. The order of Steps 320 to 350 can vary. The luminance of the organic light-emitting diode of each of the colored pixels is regulated (Step 360) such that the sum of the gamut-defining pixel peak luminances is less than the display peak luminance. Further details of the luminance regulation step will be described.

Figure 6:
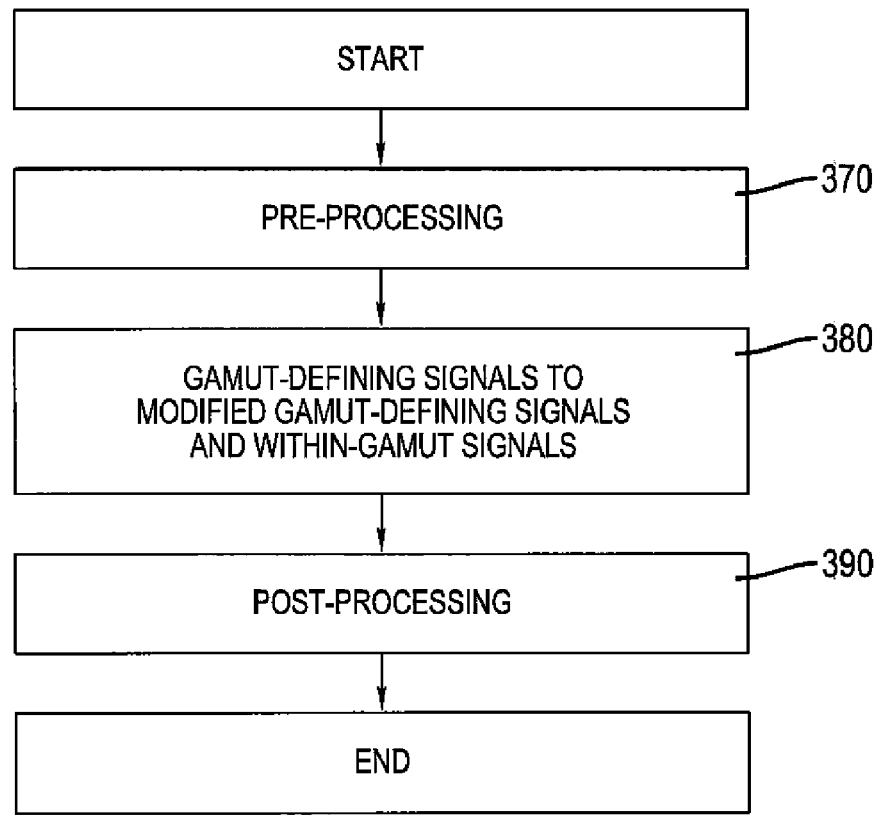
FIG. 6 is a block diagram showing a portion of the method of FIG. 5 in greater detail.

FIG. 6 is a block diagram showing the luminance regulation step (Step 360) of FIG. 5 in greater detail. Luminance regulation can include converting gamut-defining pixel signals to modified gamut-defining pixel signals and within-gamut pixel signals (Step 380). Such a conversion step has been taught by Murdoch et al. in U.S. Pat. No. 6,897,876 B2, the contents of which are incorporated by reference. In the '876 patent, a method is described for transforming three color input signals (R, G, B), corresponding to three gamut-defining color primaries, to four color output signals (R', G', B', W) corresponding to the three gamut-defining pixels and a fourth within-gamut pixel. The input and output signals are proportional to the luminance of the pixels, and therefore also proportional to the current through the pixels. Luminance regulation can also include one or more pre-processing steps (Step 370) and one or more post-processing steps (Step 390). In general, pre-processing steps are those operations to be described below that are performed on one or more of the three color input signals (R, G, B). Post-processing steps are those to be described below that are performed on one or more of the four color output signals (R', G', B', W). For the purpose of this invention, post-processing steps will primarily be performed on the R', G', and B' signals. Pre-processing and post-processing steps will be described in more detail.

As mentioned above, the within-gamut pixel is more efficient than at least one of the gamut-defining pixels and is typically more efficient than all of the gamut-defining pixels. This means that the current—and therefore also the power—needed to drive the within-gamut pixel to maximum luminance is less than that needed for the less efficient gamut-defining pixels. By considering only the voltage requirements of the within-gamut pixel, it is possible to reduce the display drive voltage, thus achieving the desirable benefit of reducing the power requirements even further, and still attain maximum luminance. In such a case, the sum of the gamut-defining pixel peak luminances would be less than the display peak luminance. This would mean that while power savings is realized, one or more of the gamut-defining pixel peak luminances would not be able to achieve unit intensity in the infrequent occasions where unit intensity of only one or two colors is required. Depending upon the method in which the gamut-defining pixels are limited, this can have an unpleasant effect on the display, e.g. loss of texture or hue shifts. Thus, it is necessary in this case to also include a method of regulating the luminance of the gamut-defining pixels to minimize unpleasant color effects while also saving power. The operations described below will provide luminance regulation by mapping a range of input signals, each corresponding to a gamut-defining pixel luminance, into a narrower range of gamut-defining pixel luminances.

Any color point, such as the white point, can be defined by its CIE 1931 chromaticity coordinates and its luminance, a triad commonly referred to as xyY values, which can be converted to CIE XYZ tristimulus values by the following equations:

$$X = \frac{x}{y} \cdot Y$$
$$Y = Y$$
$$Z = \frac{(1-x-y)}{y} \cdot Y$$

Typically, the Y values have units of luminance, such as cd/m². However, white point luminance is often normalized to a dimensionless quantity with a value of 100, making it effectively percent luminance factor. Herein, the term "luminance" will always be used to refer to percent luminance factor, and XYZ tristimulus values will be used in the same sense. Thus, a common display white point of D65 with xy chromaticity values of (0.3127, 0.3290) has XYZ tristimulus values of (95.0, 100.0, 108.9). In a typical prior art RGBW display system, the nominal peak luminance of the R, G, and B pixels are selected such that when all three emit light at nominal peak luminance, wherein each receives its nominal peak current, they produce the display white point and peak luminance, for example a luminance of 200 cd/m² at the D65 point. However, for the sake of power efficiency, the RGB pixels will never all be on together, since the W will be used in their stead to produce some or all of the luminance. Despite this fact, accurate color reproduction of all colors in the additive RGB gamut requires that the RGB pixels be able to reach their nominal peak luminance.

Explaining this further requires the use of a phosphor, or primary matrix (pmat). Assuming the ITU-R Rec. BT.709 (HDTV) primaries and white point (D65), and working in percent luminance factor, the pmat is:

$$pmat_{RGB} = \begin{bmatrix} 41.2 & 35.8 & 18.0 \\ 21.3 & 71.5 & 7.2 \\ 1.9 & 11.9 & 95.1 \end{bmatrix}$$

A simple additive color model says that the color stimulus, in terms of CIE 1931 XYZ tristimulus values, produced by a display with a given pmat and a triad of RGB intensity values is determined by the following equation, which helps explain the meaning of the nine elements of the pmat:

$$pmat_{RGB} \times \begin{bmatrix} R \\ G \\ B \end{bmatrix} = \begin{bmatrix} X \\ Y \\ Z \end{bmatrix}$$

The first column contains the XYZ tristimulus values of the R pixel at nominal peak luminance, the second the G pixel, and the third the B pixel. Looking at the middle row of the pmat, this means that the R pixel at nominal peak luminance has a luminance Y of 21.3, while the G and B have luminances of 71.5 and 7.2, respectively. Because the luminances are actually percent luminance factors, meaning they have been normalized to 100% of the display peak luminance, these three percent luminance factors sum to 100, and the R contributes 21.3% of the luminance to make white.

An RGBW system adds a fourth column to the pmat, the XYZ tristimulus values of the W pixel. In a simple case, the W primary has the same chromaticity coordinates as the display white point, meaning it can be used alone to produce white. This simple case is convenient because it obviates the normalization steps that the RGB-to-RGBW algorithm employs. Typically, the W pixel intensity is normalized such that the RGB pixels can reproduce its color, and this unit intensity can be used as the W nominal peak luminance. In this case, it means the W column of the pmat is exactly the XYZ tristimulus values of the D65 white point:

$$pmat_{RGBW} = \begin{bmatrix} 41.2 & 35.8 & 18.0 & 95.0 \\ 21.3 & 71.5 & 7.2 & 100 \\ 1.9 & 11.9 & 95.1 & 108.9 \end{bmatrix}$$

In prior art displays, the RGB peak luminances sum to 100% of the display peak luminance. However, as described herein, it can be necessary that they be limited to some smaller amount, say 75%, by regulating the peak current—and therefore peak luminance—of one or more of the gamut-defining pixels to be less than the nominal peak current—and nominal peak luminance—for the corresponding pixel. In such a case, there is no way to produce a full-luminance red of 21.3% of the display peak luminance, as the red maximum is now 21.3*.75, or 16.0% luminance factor. Given this limit, there are a number of ways to reduce the red peak luminance signal, e.g. clipping, scaling, nonlinear compression, desaturation, and dimming. Each variation is described below. For convenience, and because the limiting case is the worst, embodiments herein assume that the RGB-to-RGBW conversion is made with 100% white mixing ratio (WMR), which is the portion of the common luminance that is transferred from the RGB pixels to the W pixel. Of course, the method may be applied for other values of WMR, such as 50% or 75%, typically with some increase in power requirement. For convenience in discussion, a common limit value will be used for all three gamut-defining pixels, but the method does not preclude different limits for each pixel. In this discussion, initial input signals will be represented as RGB, while those resulting from the RGB-to-RGBW conversion described by Murdoch et al. will be represented as R'G'B'W. Further signals resulting from post-processing Step 390 of FIG. 6 will be represented as R"G"B"W. Since W is often unchanged in many of these operations, it will not always be shown in all examples. Where applicable, signals from pre-processing step 370 will be represented as R†G†B†.

In the present discussion, RGBW values are modified in various ways. It is important to remember that the relative ratios between the RGBW values determine the chromaticity coordinates of the color that will be produced by the display. Thus, RGBW quads (1,0.5,0,0) and (0.5,0.25,0,0), both having the R:G:B:W ratio 2:1:0:0, have the same chromaticity coordinates, even though the overall luminance of the first is twice that of the second. Algorithms that preserve R:G:B:W signal ratios generally do not distort chromaticity coordinates, and the term "preserving color accuracy" is used to describe this behavior. Ignoring the W signal is appropriate if the W pixel and the display white point have the same or similar chromaticity coordinates. In this case, the R:G:B ratio describes the "hue" of the color, which can remain constant even if the W changes, and likewise the chromaticity coordinates change. Algorithms can preserve the R:G:B signal ratio, and the term "preserving hue" is used to describe this behavior. The term "saturation" is used in the colloquial fashion to describe the purity of a color, which is also described by the relationship between the RGBW values. A color of high saturation has a low W value and large ratio between the maximum and minimum RGB values, eg the RGBW quad (1,0, 0.1,0) represents a highly saturated color because W is 0 and the ratio between the max RGB (1) and the min RGB (0) is large. Contrarily, the RGBW quad (1,1,0.9,0) is unsaturated because, while the W is 0, the ratio between the max (1) and the min (0.9) is close to unity. Algorithms that lower the purity of colors are referred to as desaturating, which means a full or partial suppression of the color information without disturbance of the luminance information in an image.

Clipping

An extremely simple solution is to clip the upper end of the RGB values to their limited maximum. In general, the method for clipping is as follows (W remains unchanged):

$$\begin{bmatrix} R'' \\ G'' \\ B'' \end{bmatrix} = \max\left( \begin{bmatrix} R' \\ G' \\ B' \end{bmatrix}, \begin{bmatrix} R'_{lim} \\ G'_{lim} \\ B'_{lim} \end{bmatrix} \right)$$

The general case allows for the limits to differ in the R', G', and B' pixels, but it is likely that they will all be the same. For example, if the limit is 0.75 for R'G'B', then any values below 0.75 remain untouched, while all values above that limit are crushed to 0.75. This unprejudiced crushing may eliminate variation, and thus texture, in colored regions of an image. Considering the endpoints, a limit of 1 results in an unmodified image, while a limit of 0 results in the W image. Because the W image intensity correlates directly with luminance and inversely with saturation with respect to the input image, the resulting image is generally rather unpleasant. Because clipping is a nonlinear operation, it can also upset the R:G:B signal ratio, which can result in changed chromaticity coordinates. For example, inputting a yellow color wherein the red signal is more intense than that of green, the red will get clipped first and thus the yellow can display a shift toward green.

Scaling

Another simple solution is to scale all of the R'G'B' values by their limited maximum, as in the following equation (W remains unchanged):

$$\begin{bmatrix} R'' \\ G'' \\ B'' \end{bmatrix} = \begin{bmatrix} R'_{lim} & 0 & 0 \\ 0 & G'_{lim} & 0 \\ 0 & 0 & B'_{lim} \end{bmatrix} \times \begin{bmatrix} R' \\ G' \\ B' \end{bmatrix}$$

For example, if the R'G'B' limit is 0.75, then the R'G'B'W signal is scaled by [0.75 0.75 0.75 1.0]. The result is a loss of luminance in the colored regions of an image, with no effect on neutrals, colors having chromaticity coordinates the same or similar to the display white point. Scaling differs from clipping in that texture is compressed rather than destroyed, but the tradeoff is a loss of luminance in all colored regions, rather than just those that exceed the limit. Because the scaling is applied to all non-neutral colors, it appears that quality is lost relatively quickly as the limit is lowered from 1. One benefit of scaling, however, is that it preserves hue. Because the RGB signals are scaled together, the R:G:B signal ratios are unchanged.

Nonlinear Compression

Nonlinear compression can also be called soft clipping. A combination of the scaling and clipping approaches, nonlinear compression scales a portion of the R'G'B' intensity range and leaves the rest untouched. For example, for a limit of 0.75, a nonlinear compression might involve leaving the (0, 0.6) interval untouched, and then squeezing the (0.6, 1) interval into the limited (0.6, 0.75) range. Of course, this can be done using a smooth function rather than piecewise linear, and the bend-over threshold ($R'_{thresh}$, 0.6 in this example) can be adjusted higher or lower. A general implementation can be made with a lookup table (LUT) or a piecewise linear function for each color, as follows for the R' pixel:

$$R'' = \begin{cases} R' & \text{if} \quad R' \le R'_{thresh} \\ m(R'-1)+R'_{lim} & \text{if} \quad R'_{thresh} < R' \le 1 \end{cases}, \text{ where}$$

$$m = \frac{R'_{lim} - R'_{thresh}}{1 - R'_{thresh}}$$

Figure 7:
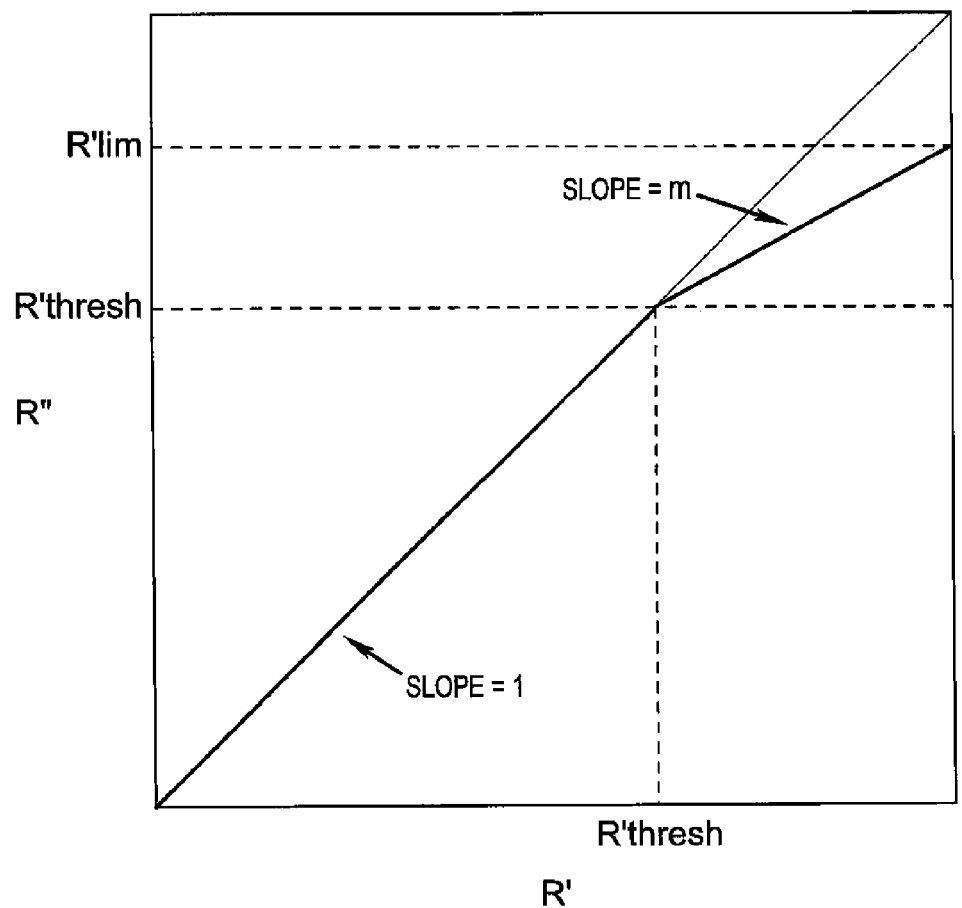
FIG. 7 is a graph showing one embodiment of luminance regulation in accordance with this invention.

FIG. 7 is a graph showing one embodiment of luminance regulation by non-linear mapping in accordance with this invention. Specifically, FIG. 7 shows the above piecewise linear function, which could easily be interpreted as a LUT from R' to R" for mapping a range of input signals into a narrower range of gamut-defining pixel luminances. Below the bend-over threshold $R'_{thresh}$, the slope is unity and the input value is unchanged. Above the threshold, the slope m is less than one. Images processed with nonlinear compression appear like a combination of clipping and scaling. Some texture detail is retained, in contrast to clipping, but it is less visible than with scaling. Likewise, the luminance of objects are somewhere between those in the preceding examples. This nonlinear approach has the same hue-changing side effect as clipping, because each signal can be modified independently, changing the R:G:B signal ratios.

Nonlinear Compression Preserving Hue

In the clipping and nonlinear compression examples above, a yellow area with a high amount of red and a slightly lower amount of green luminance showed a tendency toward a green hue. The nonlinear algorithm compresses R' by a factor between 1 and the R'G'B' limit, depending on its intensity. Since G' is lower to begin with, it is compressed by a smaller factor, meaning that the resultant R:G ratio is lower than it was at the start. The nonlinear compression algorithm can be improved by including a hue-preserving step, which follows the above algorithm with a restoration of the red, green, and blue ratios. This is done by lowering the remaining signals by the same scale factor that was applied to the highest intensity signal. A LUT or piecewise linear function can be used to calculate a scale factor for each gamut-defining pixel signal, as shown below for the R' signal:

$$s_{R'} = \begin{cases} R' & \text{if} \quad R' \le R'_{thresh} \\ m(R'-1)+R'_{lim} & \text{if} \quad R'_{thresh} < R' \le 1 \end{cases}, \text{ where}$$

$$m = \frac{R'_{lim} - R'_{thresh}}{1 - R'_{thresh}}$$

The smallest scale factor of the three is applied to all three, thus preserving hue (W is unchanged):

$$s = \min(s_{R'}, s_{G'}, s_{B'})$$

$$\begin{bmatrix} R'' \\ G'' \\ B'' \end{bmatrix} = s \cdot \begin{bmatrix} R' \\ G' \\ B' \end{bmatrix}$$

Equivalently, a single scale factor may be computed for the largest of the three gamut-defining pixel signals, and that factor applied to all three signals.

In the case of a yellow that has a higher red than green luminance, G' is compressed further than with nonlinear compression, such that the R:G ratio is restored. To implement this, all three gamut-defining pixel intensity values are scaled by the factor determined by nonlinear compression of the highest value. The hue preservation step results in lower power relative to the unmodified nonlinear compression solution.

CMY Limit

A variation on the above algorithms can be made by limiting the luminance of the secondary colors, rather than the primary colors. In an RGBW system, the gamut-defining primaries are RGB, and the secondaries are the pairwise combinations of them, R+G (yellow, Y), R+B (magenta, M), and G+B (cyan, C). An embodiment of the current invention includes regulating the sum of peak currents—and peak luminances—for any two gamut-defining pixels, such that the sum is less than the sum of the nominal peak currents—and peak luminances—of the corresponding pixels. This process can be done instead of, or in addition to, regulating the peak luminance of RGB. This concept can be applied to any of the algorithms described herein with little modification. For example, to apply a CMY limit using nonlinear compression with hue preservation, the CMY values are computed, for example using a simple matrix operation, which includes a normalization factor of ½ to keep the CMY values within the range of 0 to 100%:

$$\begin{bmatrix} C \\ M \\ Y \end{bmatrix} = \frac{1}{2} \begin{bmatrix} 0 & 1 & 1 \\ 1 & 0 & 1 \\ 1 & 1 & 0 \end{bmatrix} \times \begin{bmatrix} R' \\ G' \\ B' \end{bmatrix}$$

Then, the CMY values are provided to a LUT or piecewise function, resulting in three scale factors, and the minimum scale factor is selected and applied to the R'G'B' values, again leaving W unchanged. With similar changes, the CMY limit can be used wherever the RGB limit is discussed, either alone or in combination with an RGB limit.

The CMY limit has a smaller impact than the RGB limit for a given limit value, because the primaries are affected half as severely as the secondaries. For this reason, the CMY limit is less effective than the RGB limit at reducing the RGB peak luminances, but very effective at reducing sums of the peak luminances. Because an RGBW display employing 100% WMR will result in one of the gamut-defining pixels emitting no light for an arbitrary color being reproduced on the display, the CMY limit is a good way to limit the total luminance of the other two gamut-defining pixels, which results in limiting the total current required by said pixels.

Desaturation

All of the above algorithms modify the R'G'B' signals without adjusting the W signal. This means that with tighter R'G'B' limits, they trend toward the unpleasant W image. A more pleasing direction would be toward a pure luminance image. The key to this is luminance preservation. The easiest way to preserve luminance is to desaturate the RGB image via a matrix operation before the RGB-to-R'G'B'W conversion, but an identical result can be made by subsequently restoring the luminance lost in any of the preceding algorithms. Desaturation is simply implemented with a 3×3 desaturation matrix (dsmat) in linear RGB intensity space, and the degree of color suppression can be easily parameterized as shown below, with the parameter v.

$$dsmat = v \begin{bmatrix} 1 & 0 & 0 \\ 0 & 1 & 0 \\ 0 & 0 & 1 \end{bmatrix} + \frac{(1-v)}{100} \begin{bmatrix} 21.3 & 71.5 & 7.2 \\ 21.3 & 71.5 & 7.2 \\ 21.3 & 71.5 & 7.2 \end{bmatrix}$$

The dsmat is a linear combination of an identity matrix and a luminance matrix. The rows in the luminance matrix are replicates of the second row of the sRGB pmat, which are the nominal peak luminances of the R, G, and B pixels. Thus, an RGB signal multiplied by the luminance matrix will result in three identical luminance values, each equal to the sum of the luminance contribution of the three pixels. The luminance matrix, since it is expressed in percent luminance factor, is divided by 100. With high values of v, the identity matrix dominates, meaning the dsmat has little or no effect on the RGB image. With low values, the luminance matrix dominates. Intermediate values blend the two endpoints smoothly. For example, for v =0.75, the dsmat follows, with strong diagonal terms and relatively small positive off-diagonal terms, meaning the RGB colors are mostly preserved but slightly mixed together:

$$dsmat_{v=0.75} = \begin{bmatrix} 0.80 & 0.18 & 0.018 \\ 0.053 & 0.93 & 0.018 \\ 0.053 & 0.18 & 0.77 \end{bmatrix}$$

The algorithm can be generalized as follows, where $R^\dagger$, $G^\dagger$, and $B^\dagger$ are the RGB values after desaturation but before the RGB-to-RGBW conversion, and said conversion is a function $f$ of an RGB trio and the white mixing ratio, WMR.

$$\begin{bmatrix} R^\dagger \\ G^\dagger \\ B^\dagger \end{bmatrix} \times dsmat_v \times \begin{bmatrix} R \\ G \\ B \end{bmatrix}$$

-continued $$\begin{bmatrix} R' \\ G' \\ B' \\ W' \end{bmatrix} = f\left(\begin{bmatrix} R^\dagger \\ G^\dagger \\ B^\dagger \end{bmatrix}, WMR\right)$$

With stronger desaturation, the luminance of the image is preserved, while the saturation is smoothly reduced; i.e., the image approaches a luminance-only image.

A result identical to desaturation can be reached by following an R'G'B' scaling operation with a luminance adjustment to the W signal. Since desaturation is easier to implement, it is preferred.

The desaturation algorithm differs from those preceding because it modifies the W pixel intensity. The preceding algorithms all reduce RGB values and leave W unchanged, which will always result in less power being used in an AMOLED display. Desaturation, however, because it increases the W to compensate for the RGB reduction, will result in lower power if the efficiency of the W pixel is sufficiently greater than the efficiency of the RGB pixels.

Dimming

A tradeoff of overall luminance for relative color accuracy can be made by simply dimming the image to the R'G'B' limit. This effectively limits the W pixel to the same level as red, green, and blue, which eliminates any loss of balance in the R:G:B:W signal ratio, thereby preserving color accuracy with respect to the lowered white point luminance. This is a very simple algorithm, as follows using a common RGB limit l:

$$\begin{bmatrix} R'' \\ G'' \\ B'' \\ W'' \end{bmatrix} = l \cdot \begin{bmatrix} R' \\ G' \\ B' \\ W \end{bmatrix}$$

In a relative space like CIELAB, because of the normalization to the white point, the image is unchanged by this overall scaling, but it is dimmer in absolute luminance. This algorithm lowers the power uniformly for all pixels. The dimming algorithm involves uniformly scaling the entire image, meaning it could be applied to the R'G'B'W signals, or equivalently it could be applied to the RGB values before the RGB-to-R'G'B'W conversion. The former is shown above, and the latter follows:

$$\begin{bmatrix} R^\dagger \\ G^\dagger \\ B^\dagger \end{bmatrix} = l \cdot \begin{bmatrix} R \\ G \\ B \end{bmatrix}$$

$$\begin{bmatrix} R'' \\ G'' \\ B'' \\ W'' \end{bmatrix} = f\left(\begin{bmatrix} R^\dagger \\ G^\dagger \\ B^\dagger \end{bmatrix}, WMR\right)$$

Desaturtion Combined with Nonlinear Compression, Preserving Hue

The preceding sections outline various algorithms for modifying color reproduction in an RGB-limited RGBW display system. One skilled in the art can easily combine elements from different algorithms, resulting in optimal trade-offs of their strengths. As an example of this, desaturation on its own preserves hue and luminance, but loses saturation. Nonlinear compression with hue preservation preserves chromaticity coordinates, but loses luminance in an unnatural, saturation-dependent fashion. Each algorithm has its benefits and liabilities, making a hybrid combination an appealing option. A perfect combination would preserve hue, mitigate the luminance and saturation losses of each algorithm, allow a significant RGB limit, and provide a low-power solution.

Figure 8:
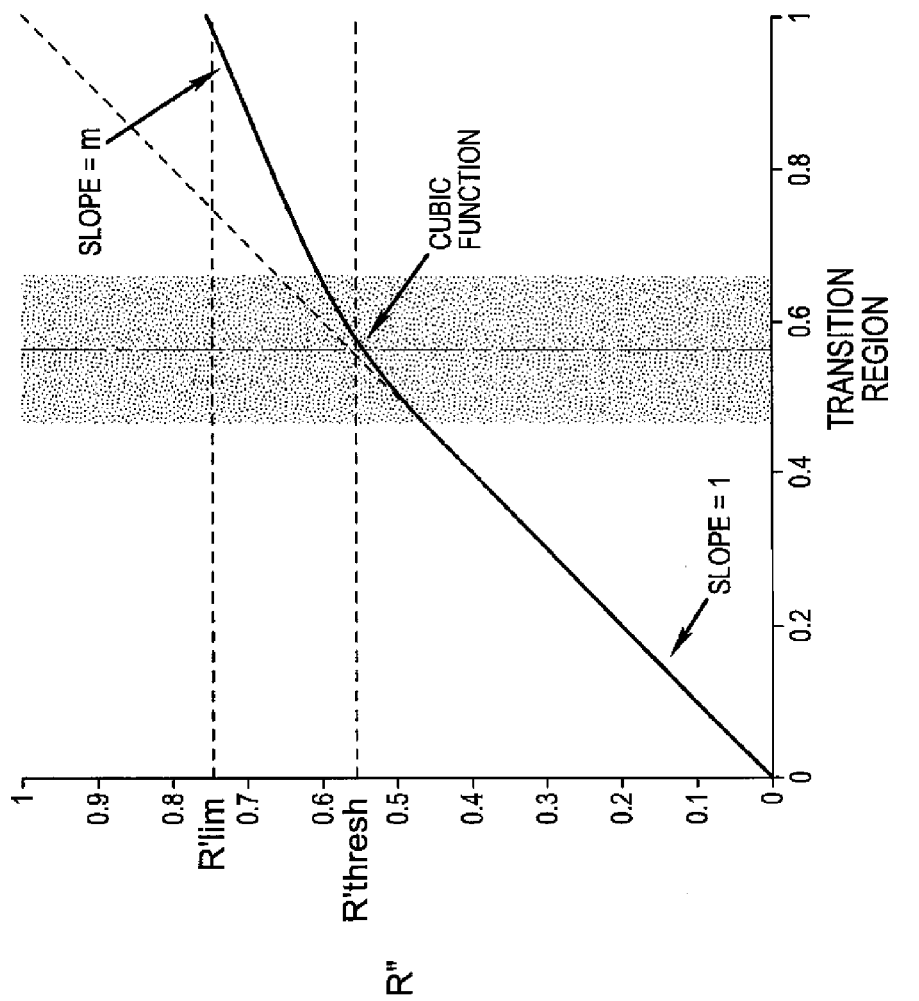
FIG. 8 is a graph showing another embodiment of luminance regulation in accordance with this invention.

With the constraint of no hue distortion, the combined algorithm has two main degrees of freedom: the amount of desaturation as determined above by the parameter v, and the RGB limit applied in the nonlinear compression. Additional variables can include a bend-over threshold in the nonlinear compression, or more generally the nonlinear shape of the intensity limiting LUT. In this example, a parameterized LUT is used that depends only on the RGB limit, thus leaving the original two degrees of freedom. The LUT is defined as a piecewise function with a smooth slope transition to avoid the abrupt transition is presented at $R'_{thresh}$ in FIG. 7. FIG. 8, which shows another embodiment of luminance regulation by non-linear mapping in accordance with this invention, shows this smooth slope transition. It is labeled as in the earlier discussion as an LUT from R' to R''. The LUT has a unity slope below the transition region, and a slope of m above the transition region, thereby compressing the input values in the domain in or above the transition region. The smooth curve in the gray transition region is, for example, a cubic function that matches the slopes of the unity- and m-sloped regions at its endpoints. In this example, $R'_{thresh}$ is computed as 0.75 times $R'_{lim}$, and the transition region is $R'_{thresh} \pm 0.1$, but these values can be modified according to need. This LUT can be described by the piecewise function:

$$R'' = \begin{cases} R' & \text{if } R' \leq R'_{thresh} - w \\ aR'^3 + bR'^2 + cR' + d & \text{if } R'_{thresh} - w < R' \leq R'_{thresh} + w \\ m(R'-1) + R'_{lim} & \text{if } R'_{thresh} + w < R' \leq 1 \end{cases}$$

where m is the slope of the upper region as defined above, w is the half-width of the transition region, and the cubic polynomial coefficients a, b, c, and d are selected such that the cubic function's values and derivatives match the linear functions at the endpoints of the transition region. Given the endpoint constraints for a given system, one can solve for a, b, c, and d with known methods.

In this way, a selected RGB limit can be used in the computation of LUTs using the preceding steps, and an independently selected desaturation parameter v can be used in computing desaturation matrices as described above. The exact parameters chosen will depend upon a number of factors, including the properties of the gamut and within-gamut pixels, types of images foreseen to be displayed on the device, and usage conditions, e.g. ambient lighting. The combination algorithm first applies the desaturation matrix to the RGB data, then performs the $R^\dagger G^\dagger B^\dagger$-to-R'G'B'W conversion, then applies the nonlinear compression, preserving hue.

Other combinations of the above algorithms are possible, as will be readily apparent to those skilled in the art.

Accounting for W Pixel Color

The above examples were shown using the simple assumption that the W pixel has the same or similar chromaticity coordinates as the display white point. In the case when that assumption is false, these example algorithms may distort the color unless some additional accounting is made for the color of the W itself. Because the W pixel is within the gamut of the RGB pixels, its chromaticity coordinates may be represented with an RGB triad. For example, given a W pixel with CIE 1931 chromaticity coordinates (0.35, 0.34), the corresponding RGB triad is (1.0, 0.68, 0.61). This means that one unit of W intensity is equivalent to the combination of 1, 0.68, and 0.61 units of R, G, and B, respectively. With this relationship in mind, any of the examples of algorithms in the present invention may be modified to account for the color of the W pixel.

Consider the simple case of scaling the RGB values in the RGBW set, using the non-neutral W cited above. For example, an RGB limit of 80% is applied to input RGBW values of (0.3, 0.4, 0.0, 0.5), resulting in (0.24, 0.32, 0.0, 0.5). The result of this is a color shift, in addition to the expected luminance loss, thanks to the color of the W pixel. Scaling the RGB values by 0.8 without modifying the W is similar to scaling the W alone by 1.25, which means adding 0.25 units of a non-neutral color, resulting in the color shift. The non-neutrality of the extra W must be accounted for. Recalling that the RGB equivalent of W is (1.0, 0.68, 0.61), by subtracting the minimum value, it is clear that the non-neutral portion is (0.39, 0.07, 0.0). The extra W in this example is (1-0.8)*0.5, or 0.1, so to correct the color of the RGBW values above, 0.1*(0.39, 0.07, 0.0) must be subtracted from the RGB values, resulting in (0.20, 0.31, 0.0, 0.5). The result is a color-balanced, but slightly dimmer version.

In much simpler terms, the W pixel described here is slightly red-orange in color, compared to the neutral display white point. Starting from a pleasing color reproduction using RGBW, if the RGB values are lowered and the W left alone, the red-orange of the W will begin to dominate. To correct this, some amount of red-orange, in this case a bunch of red and a little green, must be removed from the image by tweaking the RGB values.

Generalizing this for the scaling algorithm, using an RGB limit of 1 and RGB equivalent of W of (Rw, Gw, Bw), the following equation may be used to subtract some of the W color from the RGB values:

$$\begin{bmatrix} R' \\ G' \\ B' \end{bmatrix} = l \cdot \begin{bmatrix} R \\ G \\ B \end{bmatrix} - (1-l) \cdot W \cdot \left( \begin{bmatrix} R_W \\ G_W \\ B_W \end{bmatrix} - \min(R_W, G_W, B_W) \right)$$

Alternatively, resulting in color-balanced but slightly brighter images, the RGB values may be corrected "upward," which poses the risk that they may run into a limit and be clipped. Conceptually, this is like adding the inverse of the W color to the RGB values. Ignoring the risk of range limits, a similar equation implements this alternative:

$$\begin{bmatrix} R' \\ G' \\ B' \end{bmatrix} = l \cdot \begin{bmatrix} R \\ G \\ B \end{bmatrix} + (1-l) \cdot W \cdot \left( \begin{bmatrix} R_W \\ G_W \\ B_W \end{bmatrix} - \max(R_W, G_W, B_W) \right)$$

Generalizing beyond simple scaling to any algorithm that modifies RGB values consistently, i.e., preserving hue, the concept is simple. Every unit of W that is gained, with respect to the RGB values, is equivalent to a combination of RGB, and the non-neutral portion of this equivalent RGB must be accounted for. As a simple example, when the W is red-orange in color, the correction may be done by subtracting the color of the W, by subtracting some red and green from the RGB; or, it may be done by adding the inverse of the color of the W, by adding some green and blue to the RGB. The former will result in slightly dimmer images, the latter in slightly brighter. Application of this concept to any of the examples provided is trivial and within the scope of the present invention.

The invention has been described in detail with particular reference to certain preferred embodiments thereof, but it will be understood that variations and modifications can be effected within the spirit and scope of the invention.

PARTS LIST

- 5 OLED display
- 10r organic light-emitting diode
- 20b pixel
- 20g pixel
- 20r pixel
- 20w pixel
- 30 pixel region
- 40 connector region
- 41 connector pad
- 42 connector pad
- 50 select line driver
- 60 data line driver
- 70 first voltage source
- 80 second voltage source
- 100 substrate
- 111 power line
- 111b power line
- 111g power line
- 111r power line
- 111w power line
- 112b data line
- 112g data line
- 112r data line
- 112w data line
- 113 select line
- 114 capacitor line
- 120r select transistor
- 121 first semiconductor region
- 124 conductive bridge
- 125 via
- 127 via
- 130r storage capacitor
- 140r power transistor
- 140w power transistor
- 141 second semiconductor region
- 142 via
- 143 power transistor gate
- 145 via
- 149 via
- 160 interpixel dielectric layer
- 181 first electrode
- 182 opening
- 200 active matrix circuitry layers
- 202 insulating layer
- 204 insulating layer
- 207 insulating layer
- 210 organic EL media
- 211 hole injecting layer
- 212 hole transporting layer
- 213 light-emitting layer
- 214 electron transporting layer
- 220 second electrode
- 230r color filter element
- 230g color filter element
- 230b color filter element
- 230w transparent filler
- 280b light emission
- 280g light emission
- 280r light emission
- 280w light emission
- 310 step
- 320 step
- 330 step
- 340 step
- 350 step
- 360 step
- 370 step
- 380 step
- 390 step
- 900 CIE color space
- 901 red emitter
- 902 green emitter
- 903 blue emitter
- 904 white emitter
- 905 color gamut

What is claimed is:

1. A method for operating an OLED display for producing a full color image at reduced power, comprising:
   a) providing a plurality of at least four different colored pixels including three different colored addressable gamut-defining pixels and a fourth addressable within-gamut pixel, each pixel having an organic light-emitting diode with first and second electrodes and one or more organic light-emitting layers provided between the electrodes;
   b) selecting a display white point, display peak luminance, gamut-defining pixel peak luminances and within-gamut pixel peak luminance; and
   c) regulating luminance of the organic light-emitting diode of each of the colored pixels wherein the sum of the gamut-defining pixel peak luminances is less than the display peak luminance.

2. The method of claim 1 wherein luminance regulation is provided by mapping a range of input signals, each corresponding to a gamut-defining pixel luminance, into a narrower range of gamut-defining pixel luminances.

3. The method of claim 1 wherein luminance regulation includes converting gamut-defining pixel signals to modified gamut-defining pixel signals and within-gamut pixel signals.

4. The method of claim 3 wherein the luminance regulation further includes scaling.

5. The method of claim 3 wherein the luminance regulation further includes clipping or non-linear mapping.

6. The method of claim 3 wherein the luminance regulation further includes a matrix operation.

7. The method of claim 1 wherein luminance regulation includes providing drive circuitry for applying a maximum voltage across the first and second electrodes of the at least four different colored pixels for regulating current through the organic light-emitting diode of each of the colored pixels wherein the maximum voltage is selected in accordance with the regulated luminance.

8. The method of claim 1 wherein the display peak luminance is provided by the within-gamut pixel or the within-gamut pixel and one or more of the gamut-defining pixels.

9. The method of claim 1 wherein the three different colored addressable gamut-defining pixels respectively produce red, green, and blue light and the fourth addressable within-gamut pixel produces white light.

* * * * *